United States Patent [19]
Golzmane

[11] Patent Number: 5,909,181
[45] Date of Patent: Jun. 1, 1999

[54] METHOD AND APPARATUS FOR INDICATING ELECTRICAL CONNECTION

[75] Inventor: Michael J. Golzmane, Chicopee, Mass.

[73] Assignee: Rexam Graphics Inc., So. Hadley, Mass.

[21] Appl. No.: 08/796,756

[22] Filed: Feb. 6, 1997

[51] Int. Cl.⁶ ................................................. G08B 21/00
[52] U.S. Cl. ..................... 340/649; 340/652; 340/635; 324/509; 324/510; 361/42
[58] Field of Search ........................ 340/649, 635, 340/652; 324/509, 510, 512, 527, 522, 525, 535, 555, 556, 133; 361/215, 42, 49, 512, 522, 523, 525

[56] References Cited

U.S. PATENT DOCUMENTS

| H1369 | 11/1994 | Verbin | 324/539 |
|---|---|---|---|
| 3,872,383 | 3/1975 | Kolodzieg | 324/510 |
| 4,016,488 | 4/1977 | Stevens | 324/510 |
| 4,200,835 | 4/1980 | Anahara et al. | 340/469 |
| 4,862,094 | 8/1989 | Wetzel et al. | 324/500 |
| 5,034,726 | 7/1991 | Blondin | 340/649 |
| 5,113,303 | 5/1992 | Herres | 361/45 |
| 5,240,022 | 8/1993 | Franklin | 137/1 |
| 5,329,949 | 7/1994 | Moncourtois et al. | 134/57 R |
| 5,576,695 | 11/1996 | Minger et al. | 340/649 |
| 5,623,255 | 4/1997 | Yang | 340/649 |

Primary Examiner—Jeffery A. Hofsass
Assistant Examiner—Julie B. Lieu
Attorney, Agent, or Firm—Burns, Doane, Swecker & Mathis, L.L.P.

[57] ABSTRACT

A ground and bond detection device for ensuring that a conductive material, such at a metal container, is properly grounded to prevent electrostatic charge buildup. The device indicates whether a ground connection between the conductive material and ground exists, and whether the ground connection has been interrupted. The device is battery-powered, portable, and can be used on conductive material which is coated with nonconductive material such as paint, dirt, or rust. The ground and bond detection device provides low-cost, reliable, portable, and safe monitoring of ground connections for, e.g., metal containers used to store flammable materials.

8 Claims, 3 Drawing Sheets

METHOD AND APPARATUS FOR INDICATING ELECTRICAL CONNECTION

FIELD OF THE INVENTION

The present invention is directed generally toward circuits for preventing or detecting potentially hazardous conditions. More particularly, the present invention provides an economical and reliable ground and bond detection circuit for detecting whether a conductive material is grounded and whether the circuit is properly connected to the conductive material.

BACKGROUND OF THE INVENTION

A variety of electrical circuits have been developed for preventing or detecting hazardous, or potentially hazardous, conditions. One potentially hazardous condition in which such a circuit is highly desirable relates to the storage of flammable materials. Flammable materials such as solvents are frequently stored in metal drums or other containers which are subject to electrostatic charge buildup. If a sufficient electrostatic charge is stored by the metal container, the flammable material stored in the container can ignite. To prevent this from occurring, it is desirable to provide the metal containers with a grounding circuit which can indicate whether the metal container is grounded or is susceptible to an electrostatic charge. Proper connection of the circuit is critical, and can be made difficult by paint, dirt, rust or other coatings which may be present on the surface of the metal container.

Commercial systems are available to monitor ground connections. For example, a system is available from Special Technical Services of Allentown, New Jersey which includes a ground clamp with an insulated contact, a processor, and a display panel. There is one processor for each clamp and container to be grounded. The processor is powered by a 117 volt AC power source and the system requires the services of an electrician to hard-wire the system using relatively expensive explosion-proof wiring. The present cost for each unit is approximately $1000, plus hard wire installation costs of approximately $1000; therefore, the present cost of providing detection devices can be approximately $2000 per container. Assuming a facility having 250 metal containers for storing flammable materials, the ground detection costs using this system can be approximately $500,000 per facility. It would be desirable for a ground detection device and system to be simple and inexpensive.

The commercial systems described above typically are not capable of indicating whether a connection is loose (i.e., subject to disconnections of, for example, 1 microsecond or more). Because a detection device which has a loose connection with a conductive material cannot be relied upon to correctly indicate whether the material is grounded, it would be desirable for a ground detection device to also indicate whether its connection to the material is loose.

Further, the commercial systems described above are fixed, since the hard wiring renders the circuitry non-portable. The indicator boxes in a conventional system also tend to be relatively large and heavy. Because these conventional systems are powered by AC wiring, they are inoperative during power failures. Conventional systems typically also use filament lamps for indicators, which are subject to burn out.

Accordingly, it would be desirable for a ground and bond detection device to be practical, low-cost, simple, reliable, portable, and intrinsically safe.

SUMMARY OF THE INVENTION

The present invention overcomes the above-described problems, and provides other advantages, in a ground and bond detection system which includes circuitry for detecting whether a ground connection exists and circuitry for detecting whether a ground connection is loose. The device circuitry includes a latch which enables the circuit to remember whether any connection break has occurred. The device is portable, uses LED indicators, is battery-powered, and includes a low battery indicator. According to one embodiment of the present invention, a pulsed test current is used to test the ground connection, and the indicators are continually flashing LED indicators; these features considerably reduce power consumption.

The ground and bond detection device provides low-cost, reliable, portable, and safe monitoring of ground connections of, for example, metal containers used to store flammable materials.

BRIEF DESCRIPTION OF THE DRAWINGS

The features and advantages of the invention can be more fully understood upon reading the following Detailed Description of the Preferred Embodiments in conjunction with the accompanying drawings, in which like reference indicia designate like elements, and in which.

DETAILED DESCRIPTION OF THE PREFERRED EMBODIMENTS

Figure 1:
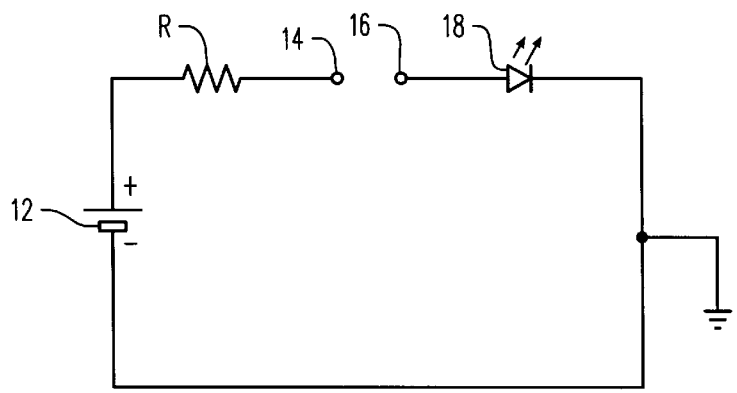
FIG. 1 is a schematic diagram of a simple circuit for indicating the presence of an electrical connection.

Referring now to FIG. 1, a schematic diagram of a simple circuit for indicating whether an electrical connection exists is shown. The circuit includes a power source 12, resistance R, connection points 14 and 16, and an indicator 18. The circuit components are arranged as shown, such that when both connection points 14 and 16 are connected to a conductive material, a complete circuit will exist, and current will flow from power source 12 through resistance R, connection points 14 and 16, and indicator 18 to ground. The current flow through indicator 18, which may be a filament lamp or LED indicator, will cause the indicator to emit light to indicate the presence of an electrical connection between the connection points, and also to indicate that the conductive material is grounded. Resistance R limits the current flow to a safe value. While the circuit of FIG. 1 indicates whether a ground connection exists, this circuit cannot reliably indicate whether the connection is loose (and therefore unreliable) or whether the power source 12 is depleted. To determine looseness (greater than a 100 Ω connection) or a low battery condition, an operator would have to carefully observe the indicator 18 and make careful judgements of lamp brightness and/or steadiness. In an implementation where the establishment of a reliable ground connection is critical, such as grounding circuitry for metal containers of flammable materials, the circuit of FIG. 1 is unreliable and insufficient.

Figure 2A:
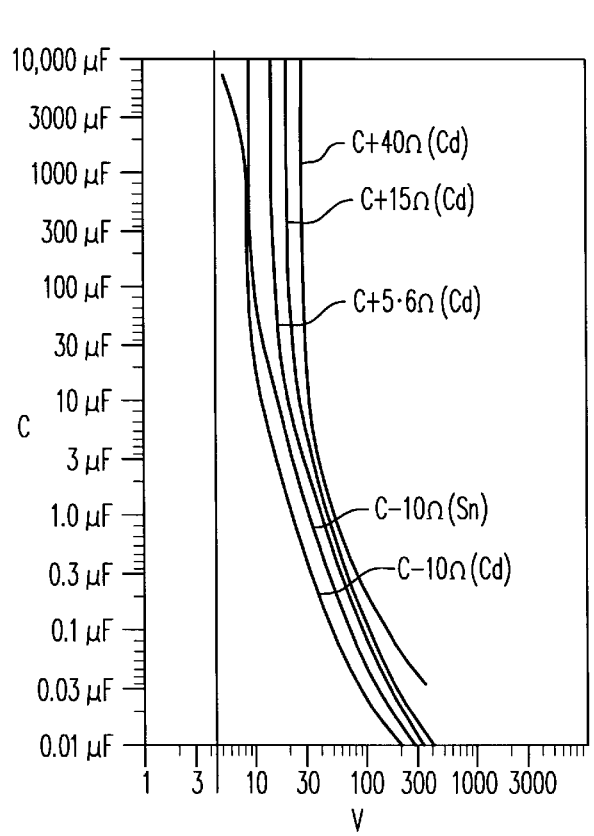
FIGS. 2A–B are ignition curves for capacitive and resistive circuits.
Figure 2B:
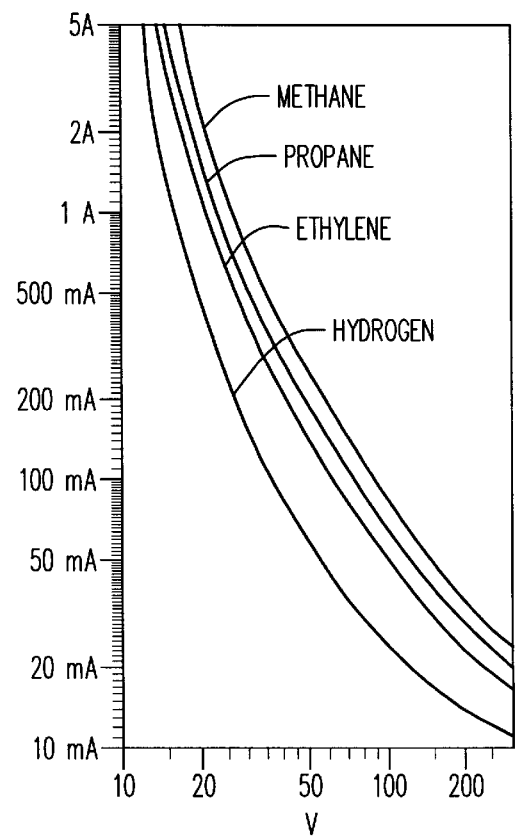

A circuit for detecting a bond and ground condition in the presence of flammable materials (i.e., a hazardous environment) should be carefully designed so that it is reliable and is intrinsically safe (that is, such that the circuit does not itself create a potential hazard). Preferably, resistors should be metal film and/or wire wound, and should be physically isolated. Capacitors should be at least 0.06" from any other wire or component. The circuit should use a supply voltage of less than 10 volts, and battery leads and connection should be sufficiently spaced (e.g., 0.1"). Referring now to FIGS. 2A–B, ignition curves for capacitive and resistive circuits, respectively, are shown. As can be seen from FIG. 2A, a total capacitance of 10,000 μF is required to achieve ignition in a circuit operating at 5 volts. Additional considerations should also be made in designing a bond and ground detection device for use in a hazardous environment. For example, if the device is battery-operated, consideration should be given to the hydrogen ($H_2$) gas produced by many batteries. Clear lens LED indicators can be used for high brightness, and provided with a thin polyethylene matte film which permits dissipation of the hydrogen gas as well as a screen to display the LED light.

Figure 3:
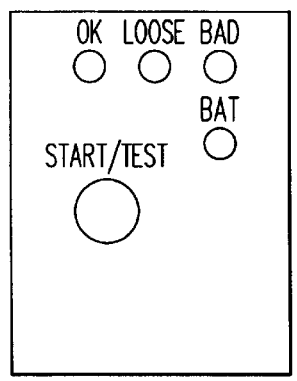
FIG. 3 is a diagram of an external surface of a bond and ground detection device according to one embodiment of the invention.

Referring now to FIG. 3, an exemplary operator interface (i.e., an indicator panel) for a bond and ground detection device according to one embodiment of the present invention is shown. The panel includes a START/TEST button, and indicator lights OK, BAD LOOSE, and BAT. In this example, these indicator lights are LEDs (light-emitting diodes) which operate to provide an easily-interpreted user interface, an example of which will now be described. The OK light indicates that a suitable ground connection exists (e.g., a connection which has less than 100Ω resistance and/or a connection which experiences breaks of less than 200 μs). The BAD light indicates that the ground connection is continuously experiencing a resistance greater than 100 Ω. The OK and BAD indicators can illuminate continuously, or can provide the relevant indications by flashing on and off, as will be described later. The LOOSE light indicates (e.g., by flashing for some period of time such as ¼ second) if any break occurs of greater than 200 μs or the ground connection experiences a resistance greater than 100 Ω. The BAT light indicates (e.g., by flashing continuously) that a battery power source has been depleted below a threshold level.

The START/TEST button can be used to initiate operation of the device. In this example, an operator depresses the START/TEST button while the device is not connected to the conductive material (i.e., the barrel or other metal container). By depressing and releasing the START/TEST button, an installation or test period is initiated which lasts for a predetermined period of time. While the START/TEST button is depressed, the bond and ground detection device in this example will perform a check of the OK indicator by causing the OK indicator to illuminate. After the START/TEST button is released, the device in this example will initiate the test period. During this period, the LOOSE light will flash for approximately ¼ second, and then stop. After the LOOSE light flashes, the BAD light will illuminate and remain illuminated. After the START/TEST button is released, the operator has the predetermined period of time (e.g., 90 seconds) to connect the bond and ground detection device to the conductive material (i.e., the barrel or other container). To conserve power, all lights are preferably turned off after the test period (i.e., after the predetermined period of time has expired). Assuming a proper ground connection is achieved during the test period, the bond and ground detection device will then continuously monitor the ground connection. If a break in the ground connection occurs, the LOOSE light will latch and continue to flash until the operator depresses the START/TEST button again. For purposes of this discussion, it is assumed that a break occurs when the ground connection experiences a resistance greater than 100 Ω, an interruption greater than 200μs, or both. It will be appreciated that the bond and ground detection device interface described above focuses on determining the integrity of a ground connection at the time of connection. An exemplary circuit to implement this interface scheme will be described below. Of course, different criteria can be used to define a break which might affect the selection of component values for the bond and ground detection circuit.

Figure 4:
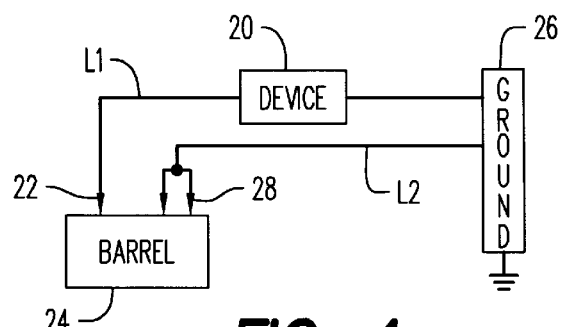
FIG. 4 is a block diagram showing an exemplary implementation of a bond and ground detection device according to one embodiment of the present invention.

Referring now to FIG. 4, an exemplary installation of a bond and ground detection device according to an embodiment of the present invention is shown. The installed bond and ground detection device 20 is connected, by an isolated contact 22, to a barrel 24. The barrel 24 is made from a conductive material and is used to store flammable materials. The installed bond and ground detection device 20 is also connected by a wire L1 to a first ground connection point on a ground element 26 connected to earth. A second wire L2 is connected between the barrel 24 and a second separate ground connection point on the ground bar 26. The wires L1 and L2 are preferably embodied by a two-wire coiled cable. The wire L2 is connected to the barrel 24 by means of one or more pointed clamp contacts 28 on the clamp. The pointed clamp contacts 28 are suitable to penetrate nonconductive coatings such as dirt, paint, or rust on the conductive material of the barrel 24, thereby enabling the bond and ground device to reliably connect the barrel 24 to ground. When installed as shown in FIG. 4, a substantially steady bond/ground test current (of, e.g., 1 mA) generated by the device 20 flows through the isolated contact 22, the barrel 24, the pointed clamp contacts 28, the wire L2, the second ground connection point on the ground bar 26, the first ground connection point on the ground bar 26, and through wire L1 back to the device 20. In this configuration, the bond and ground detection device monitors both wires L1 and L2, the connection to the earth ground, and the connection of the earth ground to the barrel 24. By having one wire (the wire L2) connecting the barrel 24 directly to the ground bar 26, this installation ensures that the barrel 24 will always be connected to ground, even during battery replacement or a period of malfunction of the device 20.

Figure 5:
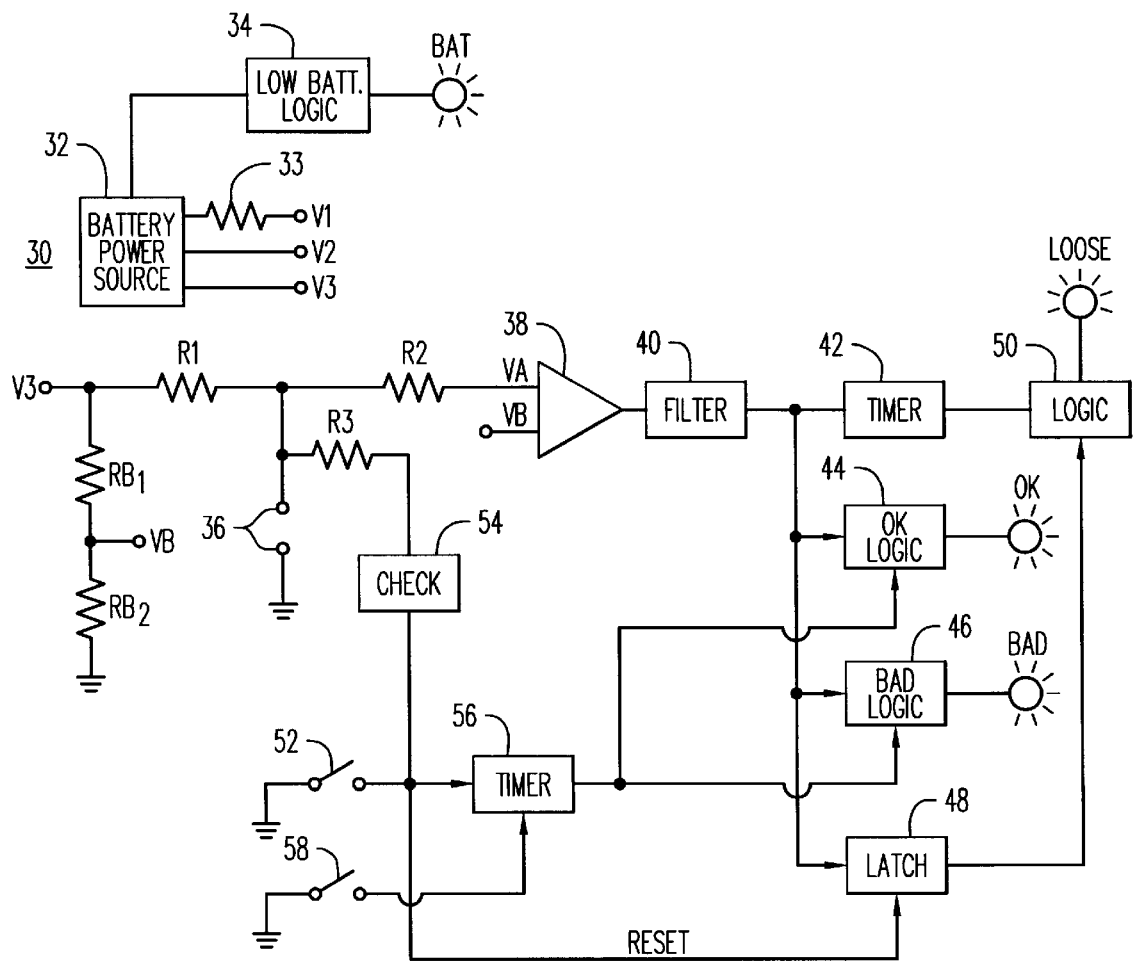
FIG. 5 is a block diagram of a bond and ground detection circuit according to one embodiment of the present invention.

Referring now to FIG. 5, a block diagram of the principal components of a bond and ground detection device according to the present invention is shown. The device includes a power supply circuit 30 which includes a battery power source 32 for providing one or more supply voltages. In this example, the battery power source 32 provides a supply voltage V1 of 4.5 volts (suitable for CMOS logic circuitry which can be used to implement the present invention), a supply voltage V2 of 3.0 volts (suitable for LEDs), and a supply voltage V3 of 1.5 volts (for the clamp contact). It will be appreciated that different voltages can be provided depending upon the selection of circuit components. A suitable resistance 33 is provided to prevent the device from drawing excessive and potentially damaging current in the event of a short circuit in CMOS circuit components. In this example, the resistance 33 is preferably a 100 Ω, wire-wound resistor rated for 3 watts; such a resistor will prevent the flow of excessive battery current in the event of a short circuit. The power supply circuit 30 further includes low battery logic 34 and an LED indicator BAT. The low battery logic 34 determines if the battery power source 32 is depleted below a threshold voltage level, and causes the BAT indicator to illuminate if the battery power source 32 is in this condition. According to a preferred embodiment, the battery power source 32 is implemented by one or more "C" batteries. By using a battery power source, the portability of the device is improved. Further, the reliability of the device is also improved, since the device is not subject to power outages, unlike conventional AC-powered devices and systems.

The device of FIG. 5 further includes barrel contacts 36 for connecting the device to the barrel 24 (see FIG. 4), resistances R1 and R2, and a comparator 38 for comparing a voltage VA present at a first terminal with a threshold voltage VB present at a second terminal. According to the preferred embodiment, resistance R1 is a 1.5 kΩ resistor, and resistance R2 is a 100 kΩ resistor. One of barrel contacts 36 is connected to a node connecting resistances R1 and R2, and the other of barrel contacts 36 is connected to ground. When the barrel contacts 36 are connected to barrel 24 (that is, connected to a conductive material), the resistance across barrel contacts 36 will be negligible, and a bond/ground test current of approximately 1 mA will flow through the barrel 24 (as described with respect to FIG. 4) and through resistance R2 to comparator 38. This results in a voltage VA of approximately 100 mV at the first terminal of comparator 38. Threshold voltage VB can be derived from the V3 terminal by voltage-dividing resistors $RB_1$ and $RB_2$ to provide a steady 100 mV voltage VB at the second terminal of comparator 38. As long as the connection between the contacts 36 and the barrel 24 is unbroken, the output of comparator 38 will be constant. If a break occurs in the connection between the contacts 36 and the barrel 24, the voltage exhibited across barrel contacts 38 will be greater than VB (in this case, 100 mV). This occurrence will change the output state of the comparator 38.

The comparator output is filtered in a filter 40, and the filtered comparator output is supplied to an edge-triggered timer 42, OK logic 44, BAD logic 46, and latch 48. If the filtered comparator output remains in an initial low state, there is no break in the connection at barrel contacts 36. In this condition, OK logic 44 will cause indicator OK to illuminate, indicating that the device is connected to the barrel, and that a ground connection exists between the barrel and ground. If the filtered comparator output remains in a high state, then there is no connection at contacts 36. In this condition, BAD logic 46 will cause the indicator BAD to illuminate and remain illuminated for a predetermined period of time, indicating that the device is not properly connected to the barrel 24. If the connection at contacts 36 is restored, the filtered comparator output will return to the low state, and BAD logic 46 will cause the indicator BAD to stop illuminating while OK logic 44 will cause the indicator OK to illuminate.

Since even a temporary break in the connection at contacts 36 can indicate an unreliable connection of the device and the barrel, the circuit includes loose connection indication means for indicating whether a break in the ground connection between has occurred. The loose connection indication means includes filter 40, edge-triggered timer 42, latch 48, LOOSE logic 50, and indicator LOOSE. In this example, the indicator LOOSE is embodied by an LM3909 LED flasher integrated circuit available from National Semi-conductor. The LED flasher stores a charge on a capacitor and connects the LED indicator LOOSE across the capacitor to illuminate the indicator while discharging the capacitor. By providing a flashing LOOSE indicator, a relatively low average battery current is used by the device to indicate a loose connection with relatively high brightness.

Latch 48 is connected to LOOSE logic 50. If the filtered comparator output indicates that there is a break in the connection at contacts 36 (that is, changes output state), the latch 48 will latch the occurrence of the break and LOOSE logic 50 will cause indicator LOOSE to flash to indicate that the connection at contacts 36 is unreliable. The latch 48 will continue to cause indicator LOOSE to flash until the latch 48 is reset, as will be described below.

If the comparator output changes state for less than the time period of the filter (in this example, 200 μs), the filter 40 prevents the loose connection indication means from being triggered. However, if the comparator output changes state for a period of time greater than the time period associated with the filter 40 (in this example, 200 μs), the output change will be detected by the edge-triggered timer 42. Once timer 42 is triggered, the LOOSE indicator will flash for a predetermined period of time. In this example, the predetermined period of time is approximately ¼ second.

The device of FIG. 5 further includes a start/test circuit, which will now be described. The start/test circuit is activated by a suitable activation means, such as a pushbutton switch 52 connected to the START/TEST button described with respect to FIG 3. When switch 52 is depressed and held, a check circuit 54 temporarily establishes a connection through a resistance R3 (of, in this example, less than 100 Ω) between one of contacts 36 and ground, to simulate a valid connection between the contacts 36 and a conductive material. As a result of the temporary connection established by check circuit 54, the indicator OK will illuminate for the duration of the temporary connection to perform the OK indicator check described with respect to FIG. 3. When switch 52 is released, the check circuit 54 is disconnected, and the output state of comparator 38 will change to cause the LOOSE indicator to flash for ¼ second. Further, the activation of switch 52 will initiate a timer 56 which runs for the duration of the test period described above with respect to FIG. 3. Thus, after the ¼ second period, the BAD indicator illuminates and remains illuminated, as long as the device is not properly connected to a conductive material, for the duration of the test period. Finally, the activation of switch 52 resets the latch 48 to stop the flashing of the LOOSE indicator.

The device of FIG. 5 can further include a second switch 58 which initiates operation of the circuit and initiates the test period, but does not activate the check circuit 54, or the loose test. This second switch 58 can be located, for example, on the clamp handle to allow an operator to initiate operation of the device merely by opening the clamp.

As noted above, the bond and ground detection device described above focuses on determining and indicating that a bond and ground connection exists at the time of connection. This ground and bond detection device can be modified more specifically to focus on indicating that a bond and ground connection exists at an alternative time, such as when flammable materials are being added to or extracted from the container. Such a modified device would preferably indicate an OK condition (reliable ground connection established) or BAD condition (no ground connection) while conserving battery resources. Accordingly, flashing LEDs can be used for the indicators BAD and OK, as well as for indicator LOOSE. These indicators can be lit by, for example, a LM3909 flasher integrated circuit which causes the indicators to flash at a 4% duty cycle. The device can be further modified to conserve battery resources by pulsing the 1 mA bond/ground test current discussed above with respect to FIG. 4. As a result of using a pulsed test current, the battery power supply circuit needs only provide a 3 volt power source as opposed to the multi-level power supply shown in FIG. 5. The modified, low-power embodiment is shown in FIG. 6.

Figure 6:
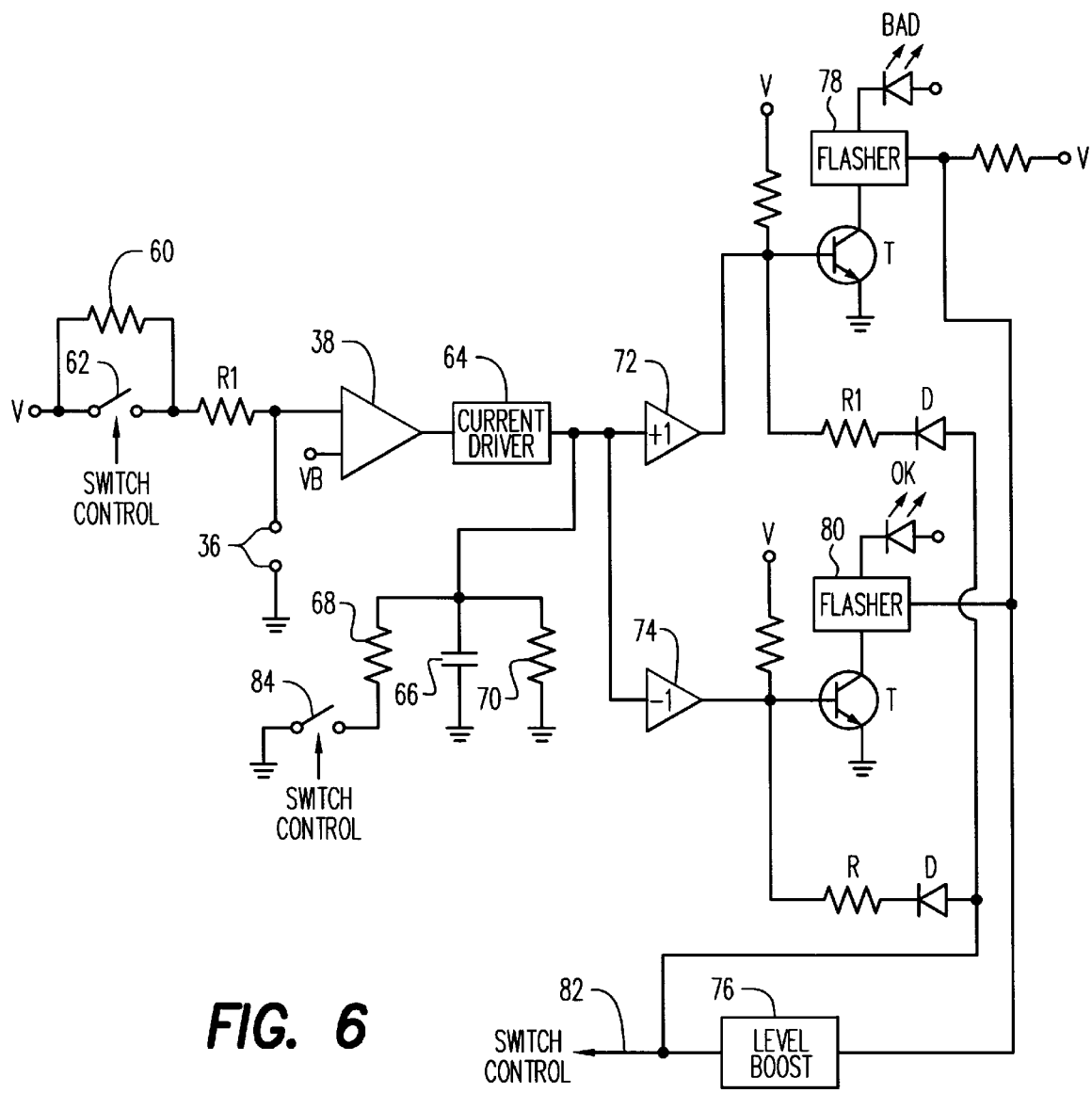
FIG. 6 is a block diagram of an alternative embodiment of the bond and ground detection circuit according to the present invention.

A feature of the embodiment of FIG. 6 is that only two indicators are used, indicator OK and indicator BAD. The circuit of FIG. 6 constantly demonstrates a good or bad condition of the ground connection at clamp terminals 36; that is, one indicator will flash at all times. Because flashing LED indicators are used, battery consumption is significantly minimized. Further, this configuration eliminates the need for a start button or switch, or a remote start button or switch. There is no need to initiate a test function because the operation of the device can clearly be determined from the constant display of OK or BAD connection status. Assuming an active battery power source, the BAD indicator will flash until the device is properly connected.

In the embodiment of FIG. 6, a resistance 60 is connected in parallel across a switch 62. In this example, resistance 60 is a 50 kΩ resistor, and switch 62 is a transistor which, when rendered conductive in response to a pulsed input (which can be derived from the flashing LED indicators and/or associated logic circuits, as explained below), outputs a pulsed bond/ground test current to resistance R1 and comparator 38. Resistance 60 allows a current to flow through the conductive material of the barrel 24 during the time intervals when switch 62 does not output a pulsed bond/ground test current. In this embodiment, the pulsed bond/ground test current is approximately 1 mA in magnitude, 2 ms in duration, and occurs about 5 times per second. This pulse is derived from the indicator OK or indicator BAD, which renders the switch 62 conductive each time the indicator OK or BAD flashes. In this arrangement, a resistance across clamp terminals 36 which is greater than 2000 Ω in between current pulses will cause the output state of the comparator 38 to be rendered high. The output of comparator 38 will likewise be rendered high if the connection experiences a resistance higher than 100 Ω during a sample current pulse. Thus, in this example, a loose condition is detected if, in the time period between sample current pulses, the connection experiences a resistance greater than 2000 Ω for greater than 200 µs. If this loose condition is detected, the indicator BAD will flash some number of times (in this particular example, 3 times) prior to returning to the OK state in which the indicator OK will flash.

The embodiment of FIG. 6 further includes a current driver 64 which receives the pulsed output of the comparator 38. When comparator 38 is at a high state (e.g., for a loose connection), the current driver 64 provides increased current to rapidly charge capacitance 66. The rapid charging of capacitance 66 captures the relatively fast loose connection noise. Preferably, the charge time of capacitance 66 is approximately 200 µs. Resistances 68 and 70 are desirable to prevent latchup of the flashing LED indicators if the DC voltage input to amplifiers 72 and 74 does not fall below the 100 mV threshold voltage level to switch the flashers from BAD to OK, and to ensure the appropriate charge and discharge time for capacitance 66.

The circuit of FIG. 6 further includes a level boost circuit 76 to provide a current boost to indicator transistors T (via steering diodes D and protective resistances R) during the flash time of either indicator OK or indicator BAD, thereby maximizing the intensity of the indicator flash while maintaining a very low average battery current drain. Level booster 76 further assists in rendering switch 62 conductive to supply the 1 mA clamp current. As shown in FIG. 6, outputs from each indicator flasher logic 78, 80 are combined and supplied to level booster 76, such that an indicator flash pulse from either indicator can provide a switch control output 82 sufficient to render switch 62 conductive. In this arrangement, a relatively large current boost is provided to the flasher logic 78 and 80 during the time of flash. It will be appreciated that if flasher logic is used which includes an on/off gate, the level boost 76 can be eliminated.

In addition to controlling switch 62, switch control output 82 also controls the operation of switch 84. Switch 84 functions to vary the discharge rate of capacitance 66, thereby altering the view time of the Loose/BAD indicator. As mentioned previously, resistance 70 functions to ensure that capacitance 66 is fully discharged to switch on one of the indicators. As the battery power supply is depleted, the 3 volt power supply drops toward 1.8 volts. As this low battery condition occurs, the flashing frequency of the indicators decreases significantly; in other words, at lower battery voltages, there is more time between flashes, and it is more difficult for an operator to view the flashes and determine the connection state of the device (e.g., whether a loose connection has been corrected). Switch 84 is rendered conductive by switch control current 82 during each flash to decrease the discharge rate of capacitance 66 and increase the flash view time, even during a low battery condition.

Figure 7:
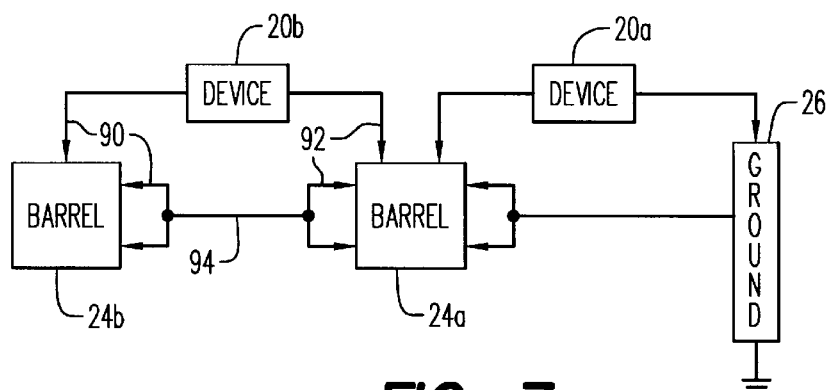
FIG. 7 is a block diagram showing a second exemplary implementation of a bond and ground detection device according to the present invention.

Referring now to FIG. 7, a second exemplary implementation of a bond and ground detection device according to the present invention is shown. In this implementation, a second bond and ground detection device 20b is provided with two clamps 90, 92 connected by an electrical conductive cord 94 of an appropriate length. The clamps 90 and 92 are attached to separate barrels 24a and 24b, respectively. Further, barrel 24a is connected to a first ground detection device 20a. In this arrangement, the second bond and ground connection device monitors the connection between the barrels 24a and 24b. It will be appreciated that this arrangement can be used to connect a relatively large number of barrels in a series, with only one barrel connected to ground.

A circuit designed in accordance with the foregoing description provides a portable, low-cost, reliable and safe means for indicating whether a ground connection exists and whether a break in the ground connection has occurred. The circuit is intrinsically safe for use in flammable or explosive environments. In particular, the circuit of FIG. 6 uses a low average battery current of approximately 600 microamps over the life of the battery. If the battery is implemented by two "c" battery cells, having a life of 7800 mA hours, the circuit can provide over 15,000 hours of continuous operation.

While the foregoing description includes many details and specificities, these are included for purposes of explanation only and are not to be interpreted as limitations of the invention. Many modifications will be readily apparent to those of ordinary skill in the art which do not depart from the spirit and scope of the invention, as defined by the following claims and their legal equivalents.

What is claimed is:

1. A device for indicating whether a conductive element is reliably connected to a ground reference potential, comprising:

a comparator which determines whether the electrical resistance between the conductive element and an element at a ground potential is greater than a predetermined reference value;

a detector which detects whether a change in state of the determined resistance persists for a minimum length of time; and a tri-state indicator which is responsive to said comparator and said detector for indicating a first state when an electrical connection is present between the conductive element and the ground potential, for indicating a second state when there is no connection between the conductive element and the ground potential, and for indicating a third state for a predetermined period when a connection between the electrical element and the ground potential has been temporarily interrupted for at least said minimum length of time switching the indication from said third state, to one of said other states at the end of said predetermined period of time.

2. The device of claim 1 wherein said minimum length of time is 200 microseconds.

3. The device of claim 1 wherein said indicator includes at least one light-emitting device which is flashed to indicate one of said states.

4. The device of claim 3 wherein said light-emitting device is flashed to indicate said third state.

5. The device of claim 4 wherein said light-emitting device is flashed for said predetermined period of time after an interruption in said connection has been detected.

6. The device of claim 5 wherein said indicator switches the indication from said third state to said second state if the connection is not restored after said predetermined period of time.

7. The device of claim 3 further including a regenerative boost circuit which is responsive to the flashing of light-emitting device for increasing power to said light-emitting device during the time that it is being flashed.

8. The device of claim 1 including a first connector for connecting said comparator to said conductive element, a second connector for connecting said comparator to said ground potential, and a third connector for connecting said conductive element to said ground potential, wherein said second and third connectors are separately connected to said ground potential.

* * * * *